United States Patent [19]

Kimura et al.

[11] Patent Number: 5,381,104

[45] Date of Patent: Jan. 10, 1995

[54] METHOD FOR THE INSPECTION OF CIRCUIT BOARD

[75] Inventors: Kiyoshi Kimura, Chiba; Yuiti Haruta, Yokohama; Keikichi Yagii, Tama, all of Japan

[73] Assignee: Japan Synthetic Rubber Co., Ltd., Tokyo, Japan

[21] Appl. No.: 9,230

[22] Filed: Jan. 26, 1993

[30] Foreign Application Priority Data

Jan. 31, 1992 [JP] Japan ................... 4-040745

[51] Int. Cl.⁶ .................................... G01R 1/073
[52] U.S. Cl. ........................................ 324/758
[58] Field of Search .............. 324/158 F, 158 P, 73.1, 324/758

[56] References Cited

U.S. PATENT DOCUMENTS

| | | | |
|---|---|---|---|
| 4,571,542 | 2/1986 | Arai | 324/158 P |
| 4,918,374 | 4/1990 | Stewart et al. | 324/158 F |
| 5,014,003 | 5/1991 | Ishikawa | 324/158 F |
| 5,057,772 | 10/1991 | Bruno et al. | 324/158 P |
| 5,065,092 | 11/1991 | Sigler | 324/158 F |
| 5,132,058 | 7/1992 | Suyama et al. | 264/24 |

OTHER PUBLICATIONS

Program Data Incorporated, "Bare Board Systems Two–Sided Simultaneous Access with Double Density" 2 pages.
Luther & Maelzer, "LM 100 Bare Board Test Systems" For economic testing of difficult boards 4 pages.
Program Data Incorporated, "Loading and Unloading Station for Translator Pins" 2 pages.
Mania, "Mania Pinserter MPI-2 Computer aided Fixturing Mania Pinsorter MPS-2 Automatic probe sortation", 4 pages.
Everett Charles Technologies, "SuperKit SMT" How to handle the toughest SMT boards you test 1 page.
Everett Charles Technologies, "Trace 90X0 Series" Designed From The Ground Up To Boost Your Test Throughput; 1 page.
Everett Charles Technologies, "Scorpion HV90SMT"; At Last, a bard board tester for the 90's 1 page.
Circuit Line Production & Testing Technology/Machinery for the P.C.B. & Multilayers Industry "Precise 2S", Precision, Speed and Reliability aren't dying out; 1 page.
Electronia AB, "DV-250 TB Analogue", Viking Bare Board Test Machines 3 pages.
Mania, "Mania Point-to-Point Test Systems"; 4 pages.
Mania, "Adapter 87"; 3 pages.
Printed Circuit World Convention VI P5, "A New Testing System for Bare Boards" by Yuichi Haruta 6 pages.

*Primary Examiner*—Ernest F. Karlsen
*Attorney, Agent, or Firm*—Oblon, Spivak, McClelland, Maier & Neustadt

[57] ABSTRACT

A method for the inspection of a circuit board, capable of precisely detecting deviation in position between the electrodes to be inspected of a circuit board and the inspection electrodes of a tester, thereby achieving fine alignment between the two, with high reliability. The method includes repeating, in two different axial directions, the measurement of conduction state between the electrodes to be inspected of a circuit board and the inspection electrodes of a tester each time changing, by a small distance, the relative position of the inspection electrodes portion of the tester and the circuit board, to detect a position of high conduction state and two positions of low conduction state which are distant from the position and located so that the position is held between them, in each of the two directions. From the information thus obtained, determining the desired connection position in which the inspection electrodes are to be in the highest conduction state in relation to the electrodes to be inspected in one or both of the directions. And then, moving the inspection electrodes portion relatively to the circuit board to place the inspection electrodes in the desired connection position.

11 Claims, 2 Drawing Sheets

METHOD FOR THE INSPECTION OF CIRCUIT BOARD

BACKGROUND OF THE INVENTION

1. Field of the Invention

The present invention relates to a method for the inspection of a circuit board, particularly to a method for inspecting a circuit board having a number of pattern electrodes by inspecting the state of electrical connection of the electrodes.

2. Discussion of the Background

In order to inspect the electrical characteristics of a circuit board in which a number of electrodes are formed, it is generally necessary to contact the electrodes to be inspected of the circuit board with the inspection electrodes of a tester having the corresponding pattern arrangement as the electrodes to be inspected, thereby achieving electrical connection between the two. Hence, conventionally, alignment between the circuit board and the inspection electrodes portion of the tester has been conducted by, for example, a means of fitting the alignment pins of the tester into the corresponding pin holes of the circuit board, or other mechanical alignment means.

In recent years, the parts packing density of a circuit board has been increased and the density of pattern has become higher. As a result, it is being pushed forward to make the electrodes of the circuit board smaller and the connection lines of the circuit board finer and arrange them in a higher density. In inspecting such a circuit board, when the alignment between the circuit board and the inspection electrodes portion of a tester is effected by a simple mechanical alignment means, merely a rough alignment state is obtained and it is impossible to sufficiently achieve the desired electrical connection between the electrodes to be inspected and the corresponding inspection electrodes.

The reasons therefor are that even when the electrodes to be inspected of the circuit board and the inspection electrodes of the tester have basically the corresponding patterns, it follows that the electrodes of the circuit board or the inspection electrodes are actually located at positions deviated, though slightly, from the design positions for the reasons associated with the production of the circuit board and tester or owing to the deformation of the circuit board and tester themselves.

Under such circumstances, it is necessary to make rough alignment between the circuit board to be inspected and the inspection electrodes portion of the tester by, for example, a mechanical alignment means and then make fine alignment to achieve precise position adjustment of the electrodes to be inspected of the circuit board and the inspection electrodes of the tester.

For achieving such fine alignment, a method has been known which comprises forming an appropriate alignment mark on a circuit board in a specific position relation to the electrodes to be inspected; forming a control alignment mark on the inspection electrodes portion of a tester in the same relation to the inspection electrodes; fixing the circuit board onto a movable stage capable of moving the circuit board in the lengthwise or crosswise direction or about the rotating axis; mounting them on the tester and checking the positions of the two alignment marks by an appropriate detection means; based on the detection result obtained, displacing the circuit board relatively to the inspection electrodes portion of the tester via the movable stage to obtain a state in which the two alignment marks coincide in position with each other.

Such a fine alignment means, however, requires that, for example, an alignment mark-observing camera or other alignment mark-detecting means are provided in order to detect the alignment marks formed on the circuit board and the inspection electrodes portion. Moreover, such an alignment mark-detecting means must be arranged above the alignment mark and in a direction vertical to the circuit board, and, as a matter of course, the inspection electrodes portion of the tester must be arranged so that the surface of the circuit board is covered therewith; hence, the alignment mark-detecting means and the inspection electrodes portion of the tester must be provided at the same place, which makes it difficult to provide them each at an appropriate place.

Further, with respect to the alignment marks per se formed on the circuit board and the inspection electrodes portion of the tester, it is impossible to completely prevent errors in position and form from being caused in the formation of said marks. Moreover, an error is caused to a certain extent in the detection per se of the degree of position-adjustment of the two alignment marks. Consequently, a complicated procedure is necessary until the desired fine alignment is achieved satisfactorily, and the achievement of fine alignment is not fully reliable in respect of repeatability, etc.

As described above, all of the conventional fine alignment methods aim at alignment between the electrodes to be tested of a circuit board and the inspection electrodes of a tester, but it is not always possible to achieve alignment with high reliability because each of the methods uses an indirect deviation-detecting means placed in a specific position relation to the circuit board or the inspection electrodes portion of the tester.

SUMMARY OF THE INVENTION

An object of the present invention is to provide a method for the inspection of a circuit board, which can precisely detect deviation in position between the electrodes to be inspected of a circuit board and the inspection electrodes of a tester, and which consequently can very easily achieve fine alignment therebetween with high reliability, and which enables the desired inspection of the circuit board to be conducted at very high efficiency.

BRIEF DESCRIPTION OF THE DRAWINGS

Other objects and advantages of the present invention will become apparent from the following description and the accompanying drawings, in which

In FIGS. 1-4, P1 and P2 refer to, respectively, an electrode to be inspected and another electrode to be inspected adjacent thereto; D1 and D2 refer to, respectively, an inspection electrode and another inspection electrode adjacent thereto; CP refers to the center of the electrode to be inspected; CD refers to the center of the inspection electrode; each of A, B and C refers to a symbol row; 10 refers to a circuit board; each of 11 to 14 refers to a tetragonal area; and 20 refers to the inspection electrodes portion of a tester.

DESCRIPTION OF THE PREFERRED EMBODIMENTS

Figure 1:
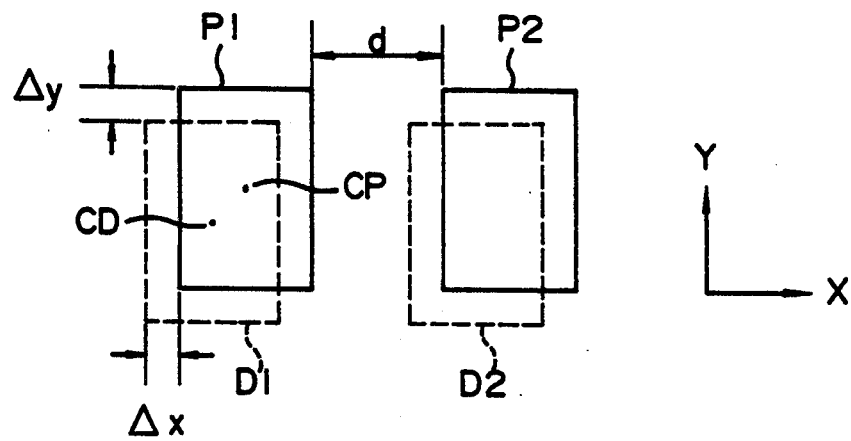
FIG. 1 is a drawing for explaining the present method for the inspection of circuit board, which shows a degree of deviation in position between the electrodes to be inspected of a circuit board and the inspection electrodes of a tester.

According to the present invention, there is provided a method for inspecting a circuit board, which comprises electrically connecting the electrodes to be inspected of a circuit board to be inspected to the inspection electrodes of a tester corresponding to said electrodes to be inspected and, in this state, inspecting the electrical conditions of the electrodes to be inspected of the circuit board using the tester, characterized in that a fine alignment operation is effected between the electrodes to be inspected and the inspection electrodes in the following two steps:

the first step comprising repeating the measurement of conduction state between the electrodes to be inspected of the circuit board and the inspection electrodes of the tester, the former being kept face to face with the latter, each time changing the relative positions of the circuit board and the inspection electrodes portion of the tester by a small distance, to detect at least one position of high conduction state (the high conduction state refers to the excellent conduction state or good conduction state described later) and at least two positions of low conduction state (the low conduction state refers to the conductible state or bad contact state described later) which are distant from said at least one position and located so that said position is held between them, in each of a direction in the plane formed by the inspection electrodes portion of the tester and another direction in the same plane which is not parallel to the former direction and, from the information thus obtained, determining the desired connection position in which the inspection electrodes are to be in the highest conduction state in relation to the electrodes to be inspected, in one or both of said directions, and the second step comprising moving the inspection electrodes portion of the tester, the circuit board to be inspected or both of them to change the relative position in a direction or another direction or both the directions so that the inspection electrodes are placed in the desired connection position determined in the first step.

In the method of the present invention, it is possible to, in the first step, detect that a relatively displaced inspection electrode is electrically connected to an electrode to be inspected adjacent to the objective electrode to be inspected and, in the second step, move the inspection electrodes portion of the tester, the circuit board to be inspected or both of them to change the relative position so that the inspection electrode is moved in a direction of from said adjacent electrode to be inspected to the objective electrode to be inspected.

In the present method, it is also possible to make fine alignment between the electrodes to be inspected and the inspection electrodes by the following three operations:

the first operation comprising carrying out the above-mentioned first step with respect to the electrodes to be inspected, present in one of the areal regions each having an area of 1/64 to 1/16 of the area of the circuit board provided on the circuit board to be inspected (referred to hereinafter as a first areal region), each of said areal regions having, preferably at least 10 fine electrodes, the second operation comprising carrying out the first step with respect to the electrodes to be inspected present in at least one of the other areal regions (hereinafter referred to as a second areal region) distant from the first areal region, and the third operation comprising moving the inspection electrodes portion of the tester, the circuit board to be inspected or both of them to change the relative position in one direction, another direction or both the directions and/or about a rotating axis perpendicular to the plane formed by the inspection electrodes portion of the tester so that the deviation in position between the circuit board and the inspection electrodes portion of the tester detected by the first and second operations can be corrected.

In the present method for the inspection of a circuit board, there is detected, in the first step, a conduction state between the electrodes to be inspected of the kept circuit board and the corresponding inspection electrodes of a tester, whereby deviation in position therebetween in one direction, another direction or both the directions, is detected and further a position relation between the inspection electrodes and the electrodes to be inspected in which the highest conduction can be achieved therebetween in said one direction, said another direction or both the directions, that is the desired connection position, is determined. Further, in the second step, the inspection electrodes are placed at said desired connection position, whereby the highest conduction can be achieved between the inspection electrode and the electrode to be inspected in said one direction, another direction or both the directions. Since this final state is the state in which fine alignment has been achieved, the intended inspection can be effected using the tester with respect to the said circuit board in said condition.

In the first step, by detecting that the displaced inspection electrode is electrically connected to the adjacent electrode to be inspected, it is possible to judge the specific direction of actual displacement of the inspection electrode relative to the objective electrode to be inspected. In the second step, accordingly, the electrode to be inspected is moved relatively to the inspection electrode in the direction opposite to said displacement direction, i.e. the direction of from the adjacent electrode to be inspected to the objective electrode to be inspected, whereby the desired fine alignment between the inspection electrodes and the electrodes to be inspected can be achieved at a high efficiency because it decreases the try-and-error type operation for the fine alignment.

By carrying out the first operation of determining the desired connection position of the inspection electrodes corresponding to the electrodes to be inspected in the first areal region of the circuit board and the second operation of determining the desired connection position of the inspection electrodes corresponding to the electrodes to be inspected in the second areal region, it is possible to judge the overall state of deviation in position between the circuit board and the tester, i.e. deviation in position in one direction or another direction and about a rotating axis. By the third operation of moving, based on this information, the inspection electrode portion of the tester and the circuit board relatively in said one direction or another direction and about said rotating axis, fine alignment between the electrodes to be inspected and the corresponding inspection electrodes can be achieved over the entire circuit board.

The present inspection method is hereinafter described specifically referring to the accompanying drawings.

In the following description, the first step is subdivided into a first stage for determining the desired connection position in one direction and a second stage for determining the desired connection position in another direction.

FIG. 1 indicates a case where in the state that a circuit board to be inspected is kept in a roughly determined position relative to the inspection electrodes portion of a tester by, for example, a mechanical alignment means, an electrode to be inspected, P1 of the electrode group to be inspected of the circuit board, to which an inspection electrode, D1 of the inspection electrode group of the tester, corresponds and which is to be electrically connected to P1 during the inspection, deviates from the desired position by $\Delta x$ and $\Delta y$, respectively, in the X axis direction of the circuit board (the abscissa direction in FIG. 1) and the Y axis direction (the ordinate direction in FIG. 1) perpendicular thereto. P2 is another electrode to be inspected which is formed adjacently to but apart from P1 in the positive X axis direction, and D2 is an adjacent inspection electrode corresponding to the adjacent electrode to be inspected P2.

The bad contact state occurring actually between an inspection electrode and a corresponding electrode to be inspected includes two cases, i.e. (1) an insufficient contact state in which the electrical resistance between the two electrodes is high and, in some cases, no conduction is obtained and (2) a short-circuit state in which the relative positions of the two electrodes are shifted and the inspection electrode contacts with another electrode to be inspected which is adjacent to the corresponding electrode to be inspected.

In the specific examples described hereinafter, attention is directed to the insufficient contact state and alignment is made. Also, when the short-circuit occurs owing to deviation in position, the information obtained from the short-circuit can also be effectively used for achieving the alignment as in the insufficient contact case as described hereinafter.

In an example of the circuit board, the dimension of each electrode to be inspected is 0.25 mm in length and 0.125 mm in width, and the distance d (refer to FIG. 1) between an electrode to be inspected and another electrode to be inspected which is adjacent thereto in the abscissa direction in FIG. 1 is 0.125 mm. The dimension of each inspection electrode and the distance between an inspection electrode and an inspection electrode adjacent thereto in the abscissa direction are the same as those of the electrodes to be inspected. Accordingly, if in FIG. 1, the inspection electrode D1 is positioned so as to completely coincide with the electrode P1 to be inspected, that is, if the center CP of P1 in the X axis direction and the Y axis direction coincides with the center CD of the inspection electrode D1 in the X axis direction and the Y axis direction and each of $\Delta x$ and $\Delta y$ is zero, the electrical resistance between the inspection electrode D1 and the corresponding electrode P1 to be inspected is at a minimum. Conversely, if $\Delta x$ is 0.125 mm or more or $\Delta y$ is 0.25 mm or more, no electrical connection is obtained between the electrode P1 to be inspected and the corresponding inspection electrode D1 and the electrical resistance between the two electrodes is virtually infinite.

In the state of FIG. 1, electrical resistance is measured for all pairs of the selected electrodes to be inspected in a selected areal region of the circuit board and the corresponding inspection electrodes; for example, when the number of the selected electrodes to be inspected is 100, all 100 pairs of the 100 selected electrodes to be inspected and the corresponding inspection electrodes are subjected to measurement of electrical resistance (a pair of an electrode to be inspected and a corresponding inspection electrode is referred to hereinafter as an electrode pair). Here the number of electrode pairs is not critical, and all electrodes to be inspected may be selected to make the electrode pairs. In such a case, the selected area means entire circuit board. However, from the viewpoint of the reliability and rapidness, the number of electrode pairs may be 50 to 200 and the selected area may include fine electrodes preferably.

Next, assuming that the state in FIG. 1 is the starting position, the electrodes to be inspected on the circuit board is displaced each time by a very small distance (e.g. 10 $\mu$m) in the positive X axis direction (the right direction in FIG. 1), with the inspection electrode portion of the tester being kept in the fixed state, and the electrical resistance of each electrode pair is measured at the respective new positions. Thereafter, the inspection electrode portion of the tester is displaced each time by a very small distance (e.g. 10 $\mu$m) in the negative X axis direction (the left direction in FIG. 1) and the electrical resistance of each electrode pair is measured at the respective new positions.

Figure 2:
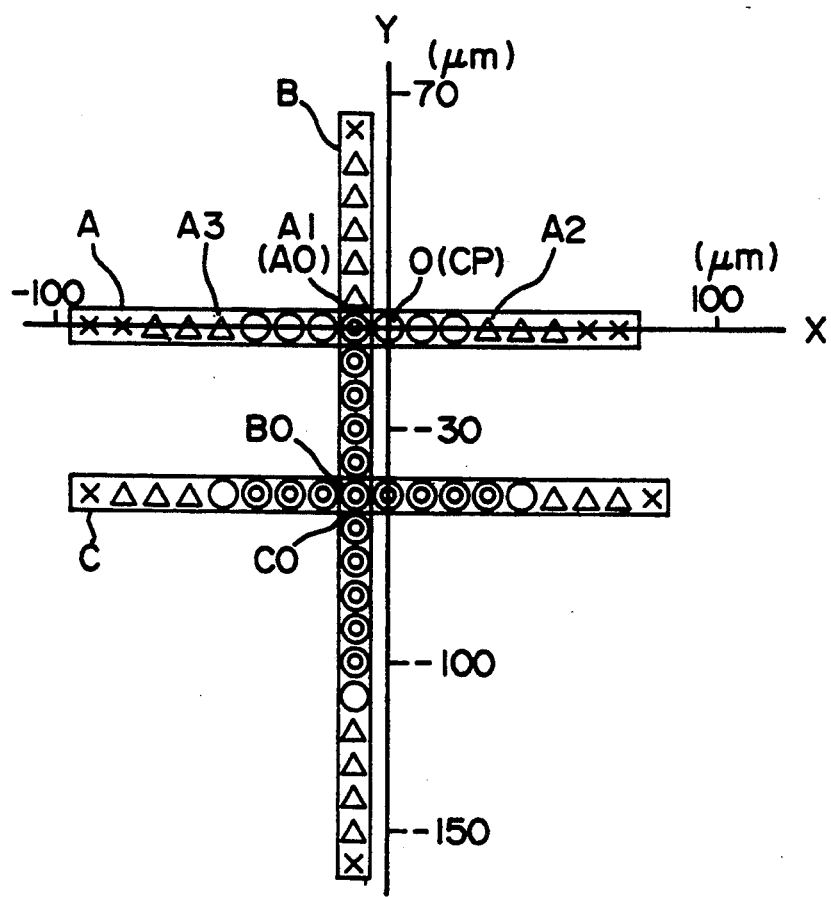
FIG. 2 is a drawing showing an example of the results of the deviation-detecting operation conducted according to the present method for the inspection of circuit board.

The thus obtained electrical resistance values (i.e. the states of connection) at various positions of a circuit board in the X axis direction can be shown by, for example, a symbol row A in FIG. 2. In FIG. 2, the X axis and the Y axis are imaginary base axes on the inspection electrode portion of the tester, and the intersecting point 0 of the X axis and the Y axis corresponds to the center CP of the electrode P1 to be inspected in FIG. 1. In the case of the symbol row A, measurements were made at 7 points in the positive X axis direction and at 9 points in the negative X axis direction. Therefore, 17 measurements in total including the first measurement were made in the X axis direction.

In FIG. 2, the symbols in the symbol row A indicate the states of connection of the electrode pairs at various positions deviated from the base point (0) in the X axis direction. The state of connection is expressed in the following 4 grades depending upon the electrical resistance values of all the electrode pairs.

"⊙" refers to excellent conduction state and is a case where the proportion of electrode pairs showing lower electrical resistance than the standard resistance (e.g. 1 $\Omega$) to all electrode pairs is 100%, and the connection state is very satisfactory.

"○" refers to good conduction state and is a case where the proportion of electrode pairs showing lower electrical resistance than the standard resistance to all electrode pairs is at least 90% and the remaining (not more than 10%) electrode pairs show electrical resistance slightly higher than the standard resistance (e.g. 10 Ω or less), and the connection state is sufficiently acceptable for the inspection purpose.

"Δ" refers to conductible state and is a case where the proportion of electrode pairs showing lower electrical resistance than the standard resistance to all electrode pairs is 50-90% and the remaining electrode pairs show electrical resistance slightly higher or much higher than the standard resistance, and connection state is such that inspection is possible but low in reliability.

"X" refers to bad contact state and is a case where the proportion of electrode pairs showing lower electrical resistance than the standard resistance to all electrode pairs is smaller than 50%, and the connection state is such that inspection cannot be effected.

Figure 3:
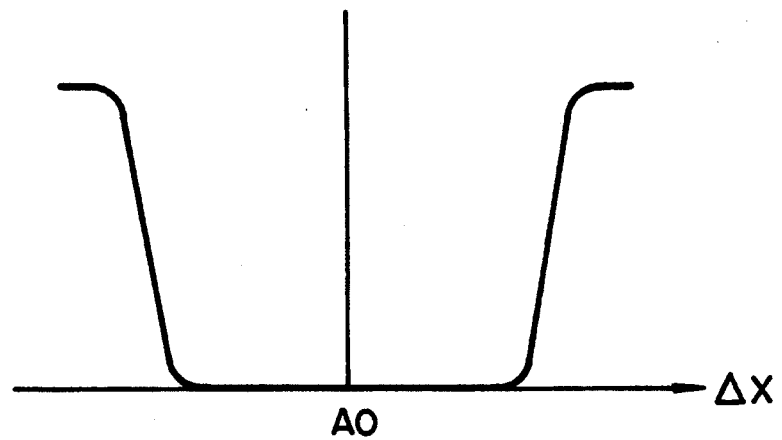
FIG. 3 is a curve for explaining the relation between displacement degree and population of insufficient contact electrodes, obtained from the results of FIG. 2.

In the symbol row A of FIG. 2, the connection state at the center CP (base point 0) of an electrode to be inspected of the circuit board which is kept in the fixed state, is not in the excellent conduction state (⊚) owing to a very small deviation in position. However, when the overall connection state in the symbol row A is looked at, it is understood that there is one region of the excellent conduction state (⊚) and two regions of the good conduction state (○) in the center, in which good inspection is possible and, on both sides thereof, there exist a region of the conductible state (Δ) and a region of the bad contact state (X) which regions are unsuited for inspection, in this order. FIG. 3 is another description of the row A. The curve means the population of the pair of electrodes which have larger resistance than standard resistance. So the center corresponds to A0, the flat area around A0 corresponds to (○) condition, rising points correspond to A3 (left side) and A2 (right side), the slant areas up to half height at the edge of the curve correspond to (Δ) condition, and the outer areas where the curve becomes higher than 50% correspond to (X) condition. The above trend is clear also from the curve. The trend in the symbol row A takes place because in each electrode pair a larger displacement gives a smaller contact area.

From the information obtained above, it is possible to determine the center position in the symbol row A which gives the best connection state, i.e. the desired connection position. That is, the position of highest conduction can be determined by calculation after detecting at least one position of the high conduction state and at least two positions of the low conduction state on both sides of said position of high conduction state. For example, in the symbol row A, the position A1, which is the only position of the excellent conduction state (⊚), is used as a base position, and attention is directed to two points A2 and A3 at which the conductible conduction state appear first on the right and left sides of A1, from which the center of A2 and A3 is determined. This position is the center position A0 of the symbol row A at which the highest conduction state is obtained. In the symbol row A, the center position A0 happens to coincide with A1. Thus, the first stage is completed.

In FIG. 2, the symbol row B is a symbol row used for making the same measurement as above, in a Y axis direction including the center position A0 of the symbol row A. In this measurement, a result similar to that of the symbol row A is also obtained and the center position B0 is determined. The symbol row C is a symbol row used for making the same measurement as above, in an X axis direction including the center position B0 of the symbol row B. In this measurement, a result similar to that of the symbol row A is also obtained and the center position C0 is determined. The center position C0 corresponds to the center CD of the inspection electrode in FIG. 1. Thus, the second stage is completed.

In the above steps, it is not always necessary to determine the center position C0 of the symbol row C. The reason is that the center positions in the X axis direction and the Y axis direction can be obtained based on the position information of the center position A0 in the X axis direction obtained in the first stage and the position information of the center position B0 in the Y axis direction obtained in the second stage. In fact, the center position B0 of the symbol row B coincides with the center position C0 of the symbol row C in many cases.

Thus, there can be found the amounts of deviations in position of the center CP (coinciding with the base point 0 in FIG. 2) of the electrode to be inspected, from the center CD (coinciding with the center position B0 or C0 in FIG. 2) of the inspection electrode in the X axis direction and the Y axis direction. Hence, in the second step in which the inspection electrodes portion of the tester is moved relatively to the circuit board so as to diminish said amounts of deviations, the center CD of the inspection electrode can be allowed to coincide with the center CP of the electrode to be inspected. This movement is made possible by a means of moving the inspection electrodes portion of the tester relatively to the circuit board which is kept in the fixed state, a means of moving the circuit board relatively to the inspection electrodes portion of the tester, or a means of moving both the inspection electrodes portion and the circuit board. Practically, however, the movement can be made by, for example, driving a movable stage for holding the circuit board, in the X axis direction and the Y axis direction.

When the second step is completed, electrodes to be inspected of the circuit board and the inspection electrodes of the tester are in a position relation in which the two are in the highest conduction state and, therefore, the desired electrical inspection of the circuit board can be immediately carried out using the tester. Since the circuit boards produced in the same process tend to have the same deviation in position from the design value, the second and later circuit boards can be put, in many cases, in the state that the same fine alignment as in the precedent circuit board is achieved between the electrodes by simply keeping the circuit boards in the same state as the precedent circuit board.

In the above series of procedures, the state of deviation in position can be grasped more quickly by, in the first and second stages (the first step), employing the following method using simultaneously the information of short-circuit.

In the first and second stages (the first step), not only is insufficient contact detected, but also it is detected whether or not electrical connection is formed between an inspection electrode and an electrode to be inspected adjacent to the objective electrode to be inspected (for example, in FIG. 1, when the objective electrode to be inspected is P1, P2 is one of the electrodes to be inspected adjacent thereto), that is, a short-circuit is formed. If it is detected that a short-circuit is formed between the inspection electrode and the electrode to be-inspected adjacent to the objective electrode to be inspected, it is possible in the tester to judge in which direction deviation in position is caused, from the position relation between the adjacent electrode to be inspected which causes the short-circuit and the objective electrode to be inspected.

Accordingly, by moving the circuit board to be inspected from the above position in the direction opposite to the specific direction of the deviation detected, the inspection electrodes portion of the tester can at once be relatively transferred to the desired connection position without repeating a try-and-error operation. As a result, the necessary fine alignment between the two electrode groups can be achieved at a high efficiency in a short time.

In the present invention, it is also possible to conduct a deviation-detecting operation consisting of the above-mentioned first and second stages (the first step), as to a plurality of areal regions separated as far as possible from one another provided in a circuit board to be inspected. This operation enables clear detection of an overall deviation state between the circuit board and a tester and, based thereon, fine alignment between all electrodes present on the circuit board and the corresponding inspection electrodes of the tester can be easily achieved with high precision.

Figure 4:
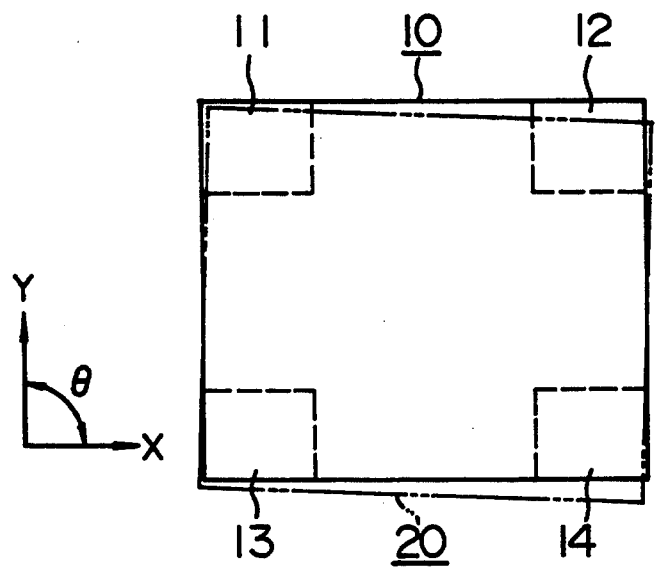
FIG. 4 is a drawing for explaining another example of the present inspection method which shows a state of deviation in position between a circuit board and the inspection electrodes portion of a tester.

A more specific description is made. As shown in FIG. 4, a deviation-detecting operation consisting of the above-mentioned first and second stages (the first operation) is conducted with respect to the electrodes to be inspected in a first areal region 11 at one corner (the upper left corner in FIG. 4) of a circuit board 10. The same deviation-detecting operation (the second operation) is conducted with respect to the electrodes to be inspected in a second areal region 14 at another corner (the lower right corner in FIG. 4) distant from the first areal region 11 in the X and Y axis directions.

By treating the information of deviation states in the areal regions 11 and 14, there can be detected the overall deviation state of the inspection electrodes portion of a tester from the circuit board 10, i.e. the degrees of the deviation in the X axis direction, the deviation in the Y axis direction and the deviation about the rotating axis which is perpendicular to the plane formed by the inspection electrodes portion of the tester. Accordingly, by moving the circuit board 10 relatively to the inspection electrodes portion of the tester in the directions in which all the deviations are corrected, fine alignment can be achieved over the entire circuit board.

In this case, it is preferable that the two areal regions be sufficiently distant from each other, in order to obtain high reliability. In order to increase the reliability, it is preferable to conduct the deviation-detecting operation in four areal regions at four corners. The more the areal regions in which detection is made, the higher the reliability becomes as a matter of course.

It is possible to carry out the inspection of conduction state in each of the areal regions independently or it is also possible to carry out simultaneously the inspection of conduction state in two or more areal regions in one relative position relation between a circuit board and the inspection electrodes portion of a tester. It is further possible to inspect the conduction over the entire circuit board at one time and then determine the deviation in position in each areal region by using the information obtained in the corresponding areal region.

In each of the above specific examples, alignment is explained as an independent process. However, by orderly keeping in store the information obtained in the first step, as to electrodes showing bad contact, as to whether the bad contact is an insufficient contact state or a short-circuit state, as to degrees of deviations in position, etc. and comparing the newly obtained information of bad contact state with the stored information, deviation in position between the inspection electrodes and the electrodes to be inspected can be inferred quickly. When several varieties of circuit boards are produced alternately, the above approach can shorten the time for alignment required when the variety of circuit boards to be produced is changed and further can improve the repeatability of alignment per se.

In the present invention, the inspection electrodes portion of a tester has been explained as part of the tester. This inspection electrodes portion may be capable of attaching to and detaching from the tester and may be composed of the inspection electrodes which are to be contacted with the electrodes to be inspected of a circuit board and which are also electrically connected to an inspection head, and a support for the inspection electrodes, and constitutes part of the tester in function. Hence, in, for example, a tester having a system in which the inspection head is electrically connected through a sheet-like connector to the electrodes to be inspected of a circuit board, said connector constitutes the inspection electrodes portion of the tester.

In the present invention, the electrodes to be inspected of a circuit board refer to the electrodes to be used for inspection in the circuit board, regardless of whether or not said electrodes constitute terminals communicating with functional parts in the said circuit board. Hence, it is possible, for example, to form electrodes exclusively used for inspection in a circuit board, and use them as a part or all of the electrodes to be inspected.

In the present invention, it is not always necessary that the dimension of inspection electrode and the distance between the inspection electrodes are the same as those of the electrodes to be inspected. It is possible, for example, to use inspection electrodes having smaller dimensions than the electrodes to be inspected. In order to obtain good inspection results, it is desirable that the dimension and distance of the inspection electrodes are substantially the same as those of the electrodes to be inspected.

In each of the first and second operations, the location of the areal region and the number of the electrodes to be inspected can be selected as desired. The larger the number of the electrodes to be inspected, the higher the reliability of deviation detection, making it possible to achieve fine alignment between the inspection electrode and the electrode to be inspected with higher reliability.

The distance of the small displacement of the inspection electrodes portion of a tester relative to a circuit board for carrying out the first and second stages is 10 $\mu$m in the above specific examples; however, this distance is not critical and may be 5 to 30 $\mu$m. When there are selected three points of different conduction states and the conduction at the center point thereof is higher than those at the other two points on both sides thereof, this information is sufficient for the determination of the desired connection position. Hence, it is sufficient in some cases that when the width of an electrode to be inspected is divided into three or more zones in the direction that the displacement is to be effected, conduction state can be measured in each of the zones. Needless to say, the smaller the distance of the above small displacement, the more precise the information obtained, making it possible to achieve fine alignment between inspection electrodes and electrodes to be inspected with higher precision though a longer time is required. Practically, measurements are made at 5 to 10 points in one direction, at least, at 3 points, preferably.

According to the method of the present invention, the state of electrical connection is checked between the electrodes to be inspected of a circuit board and the fixed inspection electrodes portion of a tester to detect deviation in position between the two; based on the information obtained, the relative position of the inspection electrodes portion of the tester and the circuit board is changed so that the deviation in position can be corrected, that is, the electrodes to be inspected are moved to the desired connection position in which the highest condition state is achieved, thereby completing the desired fine alignment between the electrodes to be inspected and the inspection electrodes. Therefore, the present method is very rational and enables fine alignment between the inspection electrodes and the electrodes to be inspected at a high efficiency with high reliability.

Further in the present method, since the tester per se is used for fine alignment, there is required no additional means for displacement detection, such as alignment mark detecting means or the like. This also gives a high efficiency to the present method, making the method advantageous also in space requirement. Thus, the method of the present invention enables desired inspection for circuit board at a very high efficiency with high reliability.

What is claimed is:

1. A method for inspecting a circuit board, which comprises electrically connecting electrodes to be inspected of a circuit board to be inspected to inspection electrodes of a tester corresponding to said electrodes to be inspected and, in this state, inspecting the electrical conditions of the electrodes to be inspected of the circuit board using the tester, characterized in that a fine alignment operation is effected between the electrodes to be inspected and the inspection electrodes in the following two steps:

the first step comprising repeating the measurement of conduction state between the electrodes to be inspected of the circuit board and the inspection electrodes of the tester, the circuit board being kept face to face with the inspection electrodes portion of the tester, each time changing the relative positions of the circuit board and the inspection electrodes portion of the tester by a small distance, to detect at least one position of high conduction state and at least two positions of low conduction state which are distant from said at least one position and located so that said at least one position is held between them, in each of a direction in the plane formed by the inspection electrodes portion of the tester and another direction in the same plane which is not parallel to the former direction and, from the information thus obtained, determining the desired connection position in which the inspection electrodes are to be in the highest conduction state in relation to the electrodes to be inspected in one or both of said directions, and the second step comprising moving the inspection electrodes portion of the tester relatively to the circuit board in a direction, another direction or both the directions so that the inspection electrodes are placed in the desired connection position determined in the first step.

2. The method according to claim 1, wherein in the first step, the measurement of conduction state is repeated each time changing the relative positions of the circuit board and the inspection electrodes portion of the tester by 5 to 3 $\mu$m.

3. The method according to claim 1, wherein in the second step, the inspection electrodes portion of the tester and the circuit board are moved relatively by a means of moving the inspection electrodes portion of the tester against the circuit board kept in the fixed state, a means of moving the circuit board against the inspection electrodes portion of the tester, or a means of moving both the circuit board and the inspection electrodes portion of the tester.

4. The method according to claim 1, wherein the fine alignment between the electrodes to be inspected and the inspection electrodes is made by the following three operations:

the first operation comprising carrying out the first step of claim 1 as to the electrodes to be inspected in one of the plural areal regions each having an area of 1/64 to 1/16 of the area of the circuit board provided in the circuit board to be inspected (referred to hereinafter as the first areal region), the second operation comprising carrying out the first step of claim 1 as to the electrodes to be inspected in at least one of the other areal regions (referred to hereinafter as the second areal region) distant from the first areal region, and the third operation comprising moving the inspection electrodes portion of the tester relatively to the circuit board in one direction, another direction or both the directions, and/or about a rotating axis perpendicular to the plane formed by the inspection electrodes portion of the tester so that the deviation in position between the circuit board and the inspection electrodes portion of the tester detected by the first and second operations can be corrected.

5. The method according to claim 4, wherein each of the first areal region and the second areal region has 50 to 200 selected electrodes as electrodes to be inspected.

6. The method according to claim 4, wherein electrical resistance is measured as to all pairs of the selected inspection electrodes and the corresponding electrodes to be inspected.

7. The method according to claim 6, wherein in the first step, measurement of electrical resistance is repeated as to all the electrode pairs each time changing the relative positions of the circuit board and the inspection electrodes portion of the tester by 5 to 30 $\mu$m.

8. The method according to claim 4, wherein the second operation is carried out in three areal regions.

9. The method according to claim 8, wherein the first operation is carried out in one corner region of the circuit board and the second operation is carried out in the remaining three corner regions.

10. The method according to claim 1, wherein in the first step, the information as to the electrical connection state between the electrodes to be inspected of the circuit board and the inspection electrodes of the tester obtained is orderly kept in store.

11. The method according to claim 10, wherein the stored information is compared with information newly obtained as to connection state to infer deviation in position between the inspection electrode and the electrodes to be inspected, thereby facilitating the fine alignment operation.

* * * * *